United States Patent [19]

Cuppen

[11] Patent Number: 4,853,635
[45] Date of Patent: Aug. 1, 1989

[54] METHOD OF RECONSTRUCTING A NUCLEAR MAGNETIZATION DISTRIBUTION FROM A PARTIAL MAGNETIC RESONANCE MEASUREMENT

[75] Inventor: Johannes J. M. Cuppen, Eindhoven, Netherlands

[73] Assignee: U.S. Philips Corporation, New York, N.Y.

[21] Appl. No.: 203,542

[22] Filed: May 27, 1988

Related U.S. Application Data

[63] Continuation of Ser. No. 62,812, Jun. 15, 1987, abandoned.

[30] Foreign Application Priority Data

Jun. 18, 1986 [NL] Netherlands .......................... 8601571

[51] Int. Cl.$^4$ .......................................... G01R 33/20
[52] U.S. Cl. ..................................... 324/309; 324/307
[58] Field of Search ............... 324/300, 307, 309, 312; 128/653

[56] References Cited

U.S. PATENT DOCUMENTS 4,701,706 10/1987 Haacke .............................. 324/307

Primary Examiner—Michael J. Tokar
Attorney, Agent, or Firm—Thomas A. Briody; Jack E. Haken; Jack D. Slobod

[57] ABSTRACT

A method is proposed for reducing the residual artefacts, such as blurring, which occurs in the image when the known methods are used, for example due to phase errors. In accordance with the proposed method, a number of steps are performed per column in the data matrix so as to produce an ever better estimation for the data not known from sampling. After the reconstruction, the image will have a phase which at least approximates the phase estimated from the central part of the data matrix. In the case of phase errors, substantially no residual artefacts will remain and at the same time the signal-to-noise in the image will be superior to that obtained by means of the known methods.

4 Claims, 2 Drawing Sheets

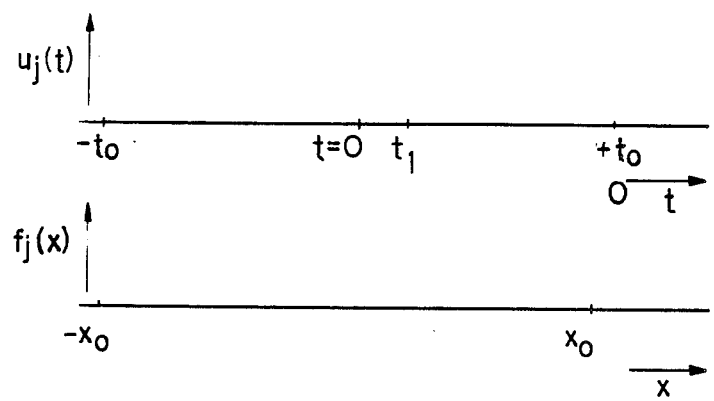
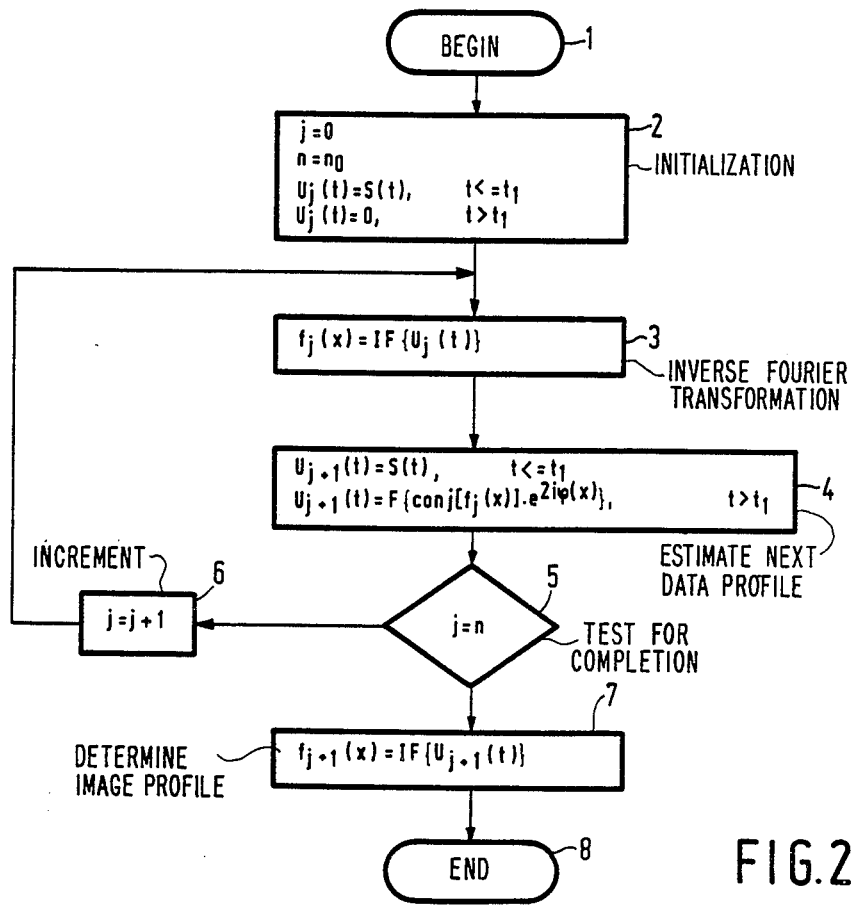

METHOD OF RECONSTRUCTING A NUCLEAR MAGNETIZATION DISTRIBUTION FROM A PARTIAL MAGNETIC RESONANCE MEASUREMENT

This is a continuation of application Ser. No. 062,812, filed June 15, 1987, now abandoned.

The invention relates to a method of reconstructing an at least one-dimensional image of a nuclear magnetization distribution in a body by a complex Fourier transformation of an at least one-dimensional data matrix which is filled with sampling values of resonance signals obtained from a magnetic resonance measurement performed on the body, the data matrix in one dimension at least half being filled with sampling values, a real and an imaginary image component being obtained after the complex Fourier tranformation, the reconstruction utilizing a phase which is estimated from data of a central part of the data matrix which is known as sampling values.

The invention also relates to a device for performing the method.

The term nuclear magnetization distribution is to be understood to have a broad meaning in the present context; inter alia terms such as spin density distribution, longitudinal relaxation time distribution, transverse relaxation time distribution and spin resonance frequency spectrum distribution (NMR location-dependent spectroscopy) are considered to be covered by the term nuclear magnetization distribution.

A method of this kind is known from the "Book of Abstracts" of the "Fourth Annual Meeting of the SMRM", held in London in 1985; page 1024 contains an abstract of a method of image reconstruction for MR images disclosed by P. Margosian. The known method has been presented as a poster at the "Fourth Annual Meeting of the SMRM" on Aug. 22, 1985. In the method disclosed by Margosian, for example a reconstruction is performed on a two-dimensional data matrix, half of which is filled in one dimension with sampling values of resonance signals obtained from a magnetic resonance measurement performed on the body. The magnetic resonance measurement is, for example a so-called spin echo measurement where the body is arranged in a steady, uniform magnetic field and spin nuclei in the body are excited by high-frequency pulses in the presence of magnetic field gradients, thus producing spin echo resonance signals. One of the magnetic field gradients, the so-called preparation gradient, assumes a different value for each spin echo resonance signal. The spin echo resonance signals are sampled and the sampling values are stored in the data matrix. For the description of a magnetic resonance apparatus and a spin echo measurement, reference is made to an article by P. R. Locher "Proton NMR Tomography" in "Philips Technical Review", Vol. 41, No. 3, 1983/84, pages 73-88. Certain parts of the description of the equipment, pulse sequences and image reconstruction methods given in the article by Locher are incorporated herein below verbatim.

For the known method Margosian assumes that the phase of the image varies smoothly and slowly changes in the relevant image dimension; he also estimates the phase from the data of a central part of the data matrix which is known as sampling values. The known method fills half the data matrix, for example by performing half the number of steps of the preparation gradient which would be required for filling the entire data matrix. In terms of the Fourier transformation to be performed on the data matrix in order to reconstruct an image, the stepping of the preparation gradient may be considered as the stepping of a pseudo-time. The "real" time can then be considered as the stepping caused by signal sampling. The dimensions of the data matrix can then be considered as dimensions in "real time" and "pseudo-time". Addition of another dimension to the data matrix (3D) can be considered as stepping in another pseudo-time. The known method fills the remainder of the data matrix with zeroes and performs a reconstruction by executing a complex Fourier transformation on the data matrix, performs a phase correction on the complex image obtained, utilizing the estimated phase, and takes the real image component of the result as the image. Margosian demonstrates that, after multiplication of the image matrix obtained after the complex Fourier transformation by the inverse of the estimated phase, the real image component thereof approximates the desired image and that the imaginary image component thereof represents the image blurring. The desired image has the same resolution as an image obtained from a complete (2D) magnetic resonance measurement. It is to be noted that it is generally known that in the absence of phase errors, where the image is purely real, only half the data matrix need be filled in order to obtain a completely filled data matrix after simple extrapolation. When the image is purely real, the data matrix is complex Hermitian (the real part thereof is even and the imaginary part thereof is odd). In practical situations, however, there will always be phase errors due to eddy currents, a shift of the centre of a spin echo resonance signal, non-ideal high-frequency pulses, and DC offsets of gradients. The simple extrapolation and the subsequent reconstruction would give rise to serious blurring artefacts in the image.

A drawback of the method proposed by Margosian consists in that residual artefacts such as blurring artefacts occur in the image. Margosian proposes a special filtering operation over the central part of the data matrix (requiring some additional resonance signals) in order to reduce so-called ringing artefacts in the image, but the effectiveness of such suppression is insufficient and the signal-to-noise ratio in the image deteriorates due to the attenuation of the image amplitude.

It is an object of the invention to provide a method for reconstructing an MR image where the residual artefacts occurring in the known method due to phase errors are substantially reduced, without affecting the signal-to-noise ratio. To achieve this, a method of the kind set forth is characterized in that in the case of more than one dimension, the complex Fourier transformation is performed first on the sampling values in the other dimensions, in the one dimension a Fourier transformation step being performed on each column partly filled with sampling values in a number of steps after an estimation for the data not known from sampling, the estimation for the data not known from sampling being adapted in each subsequent step in order to obtain, after reconstruction, an image whose phase at least approximates the phase estimated from the central part of the data matrix. Thus, an image is obtained which is substantially free from blurring artefacts when the phase errors are not excessively large.

A version of a method in accordance with the invention, involving an initial estimation for the data not known from sampling, is characterized in that in a step after the Fourier transformation step of the column a next estimation is obtained for the data not known from sampling in the column from an image profile thus obtained in the one dimension, said next estimation, after Fourier transformation thereof followed by elimination of the phase, increasing the real image component in the image profile and decreasing the imaginary image component in the image profile, after which in subsequent steps ever smaller imaginary image components and an ever better approximation of the phase of the image profile are obtained. It is thus achieved that each subsequent estimation is a better approximation of the data not known from sampling. For example, zeroes are taken as the initial estimation for the data which are not known from sampling.

A preferred version of a method in accordance with the invention is characterized in that the next estimation for the data not known from sampling values is realized by performing a Fourier transformation on the conjugated complex image profile of the preceding estimation with double the phase. Thus, an efficient execution of a method in accordance with the invention is achieved with a suitable convergence towards the desired image.

The method is performed, for example by means of programmed arithmetic means in an MR device which is known per se.

The invention will be described in detail hereinafter with reference to the accompanying diagrammatic drawings; therein:

FIG. 1 shows a time axis with different instants which are important for the method in accordance with the invention, as well as an image profile axis, FIG. 2 shows a flowchart of a version of the method in accordance with the invention for an image profile.

Figure 4:
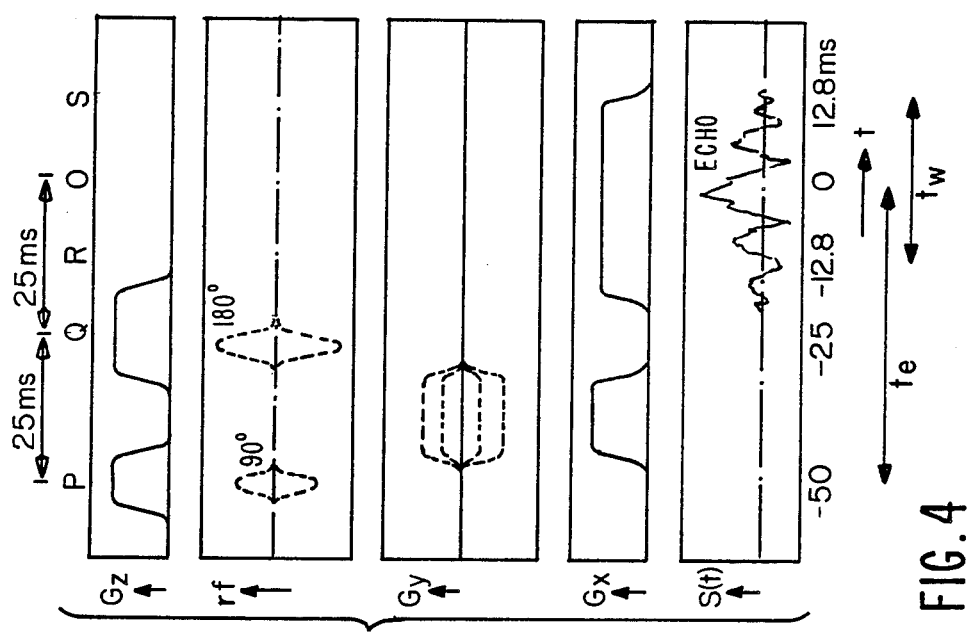
FIG. 4 is a graphic representation showing a practical example of a pulse and gradient sequence.

As is described in the Locher article, in the practice of NMR tomography, when a proton is placed in a constant magnet field of flux density B its spin describes a precessional motion around the direction of the fields. The angular frequency $\omega$ of this 'Larmor precession' is proportional to the flux density: $\omega = \gamma B$; the quantity $\gamma$ is called the gyromagnetic ratio of the proton. An r.f. magnetic field perpendicular to the constant field excites the precession if its frequency is equal to the precessional frequency. This is the basis of the nuclear magnetic resonance (NMR). It is also possible to observe NMR by using other atomic nuclei provided that, like the proton, they have an angular momentum and thus possess a magnetic moment.

An NMR tomograph thus consists of the following components:

a magnet (M), large enough to enclose a human subject, and producing a highly uniform field in a space of dimensions say 40 cm×40 cm×30 cm;

gradient coils ($G_x, G_y, G_z$);

r.f. excitation and detection equipment;

a unit that controls the sequences of gradients and r.f. pulses;

a computer to translate the scanning signals into an image; a two-dimensional Fourier transformation is an important part of the computer program.

The following are some typical values for a tomograph: flux density of the magnetic field $B_O$ about 0.15T (1400 Gs), field homogeneity 1 part in $10^5$ throughout a volume of 40 cm×40 cm×30 cm; precessional frequency $\omega_o/2\pi$ of the protons in this field: about 6 MHz ($\gamma/2\pi = 42.576$ MHz/T for protons in water); gradients: 5 to $20 \times 10^{-4}$ T/m, which amounts to a difference of about 0.15 to 0.6 percent from one end of the region of homogeneity to the other; time for measuring one slice about five minutes.

The r.f. equipment comprises an r.f. oscillator with an angular frequency $\omega_o$ approximately equal to the central Larmor frequency of the spin system. During an r.f. pulse the oscillator generates an r.f. magnetic field in the spin system by means of an excitation coil. We treat the r.f. field as a field of flux density B, that is circularly polarized in the x, y-plane and of angular velocity $\omega_o$.

After an excitation pulse the Larmor precession of the spins induces an r.f. voltage across the ends of a detector coil whose axis is parallel to the y-axis. This signal, called the 'FID signal' (free induction decay), has the nature of a modulated carrier with a centre angular frequency $\omega_o$; the modulation contains the information. This is recovered by means of double phase-sensitive detection (PD). Two low-frequency signals ($S_1(t)$ and $S_2(t)$) are produced, each of which is obtained by mixing the r.f. signal with (i.e. multiplying it by) a reference signal from the r.f. oscillator and filtering with a lowpass filter. The two reference signals differ in phase by 90°. The signals obtained can be combined to form a complex signal $S(t) = S_1 + jS_2$.

To obtain an image of a cross-section of the body in 'slice' of thickness say 0.5 cm is 'selected', e.g. by exciting only the spins in that slice. The way in which this is done will be explained presently. One of the methods of obtaining a 2D image of this slice is known as '2D projection reconstruction'.

In general terms the procedure is as follows. A direction $\mu$ in the plane of the slice is selected, and a field gradient is applied in that direction. In each narrow strip of the slice perpendicular to $\mu$ the spins have the same frequency and are thus added together in the spectrum of the FID signal. The spectrum is thus a projection of the proton distribution. The measurement is repeated for, say, 200 directions $\mu$ and the 2D distribution itself is reconstructed from the projections obtained.

This account of the procedure requires a small correction. We should first note that reconstructing the distribution of a material from its projections is a problem that can be approached mathematically in different ways. We are concerned here only with a relatively simple version, based entirely on Fourier transformation. In this version the first step is usually the determination of the Fourier transform of each projection. In NMR projection reconstruction, however, this step is not present, since the measured FID signal is already the Fourier 'partner' of the projection ('the projection is the spectrum of the signal') so that the reconstruction can be started immediately here without first having to resort to the projections. The projections are only included for purposes of explanation. However, we will retain the name 'NMR projection reconstruction', in accordance with conventional usage.

Let us now consider the method in more detail. The function f(x,y) we are looking for—in the simplest case the proton distribution in the x,y-plane—may be shown for a hypothetical case by means of 'contour lines'. In general f(x,y) is a complex function. The reconstruction takes place via the 2D Fourier transform of f(x,y):

$$F(k_x, k_y) = \int\int f(x, y)e^{j(k_x x + k_y y)} dx dy$$

All integrals in this section run from $-\infty$ to $+\infty$. $F(k_x,k_y)$ is a function (again complex) in the plane of the variable $k_x,k_y$ shown by contour lines. The reconstruction is based on the theorem: the FID signal, recorded with a gradient G in the direction $\mu$, is a 'cross-section' of $F(k_x,k_y)$ along a corresponding line $k\mu$ in the $k_x,k_y$-plane. 'Cross-section' here refers simply to $F(k_x,k_y)$ itself on a line $k\mu$. 'Corresponding' means that $k\mu$ in the $k_x,k_y$-plane has the same orientation as in the x,y-plane. The theorem above states that the curve has the same shape as the signal S(t), recorded with a gradient in the corresponding direction.

Starting from this theorem, we proceed as follows in NMR projection reconstruction. The FID signal is recorded for a large number of directions $\mu$. From the cross-sections of $F(k_x,k_y)$ thus obtained $F(k_x,k_y)$ itself is determined. A 2D Fourier transformation completes the reconstruction of f(x,y).

With 2D projection reconstruction the information is obtained in the $k_x,k_y$-plane from points along a large number of lines through the origin. This has its disadvantages. The data acquisition is very inhomogeneous: very dense at the center and thin at the edge. It is therefore better—and for other reasons as well—to collect the information from points along a number of parallel lines. This is done in 'Fourier zeugmatography'.

The method can be explained by extending the formulation of NMR projection reconstruction given above. A succession of different gradients can be considered as an 'excursion' in the $k_x-k_y$-plane, with the instantaneous velocity given by the instantaneous gradient G via the relation $$\frac{dk}{dt} = \gamma G;$$

for such an excursion the instantaneous signal value S(t) gives the F-value at the point reached.

In a time $\delta t$ the signal S(t) changes because the phase angle $(\omega-\omega_o)t$ changes, and F changes because of the excursion in the $k_x,k_y$-plane. The change in the phase angle is $(\omega-\omega_o)\delta t = \delta(G_x x + G_y y)\delta t$, and this is equal to $x\delta k_x + y\delta k_y$. Consequently, $\delta S$ is always exactly equal to $\delta F$ in such an excursion.

Figure 3:
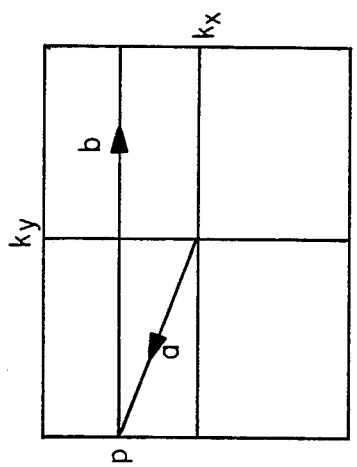
FIG. 3 shows a Fourier zeugmatography scan sequence.

In projection reconstruction, excursions are only made at constant velocity along straight lines through the origin. In Fourier zeugmatography excursions of the type shown in FIG. 3 are made in the 'preparation period' the system is excited by a 90° pulse, and a positive y-gradient and a negative x-gradient are applied. An excursion is then made along the line a. When the point P is reached, both gradients are removed. Next a positive x-gradient is applied and the detector signal is recorded (detection period). This gives the cross-section of F along the line b. Selecting different values for the y-gradient in the preparation period gives different starting points and hence different cross-sections. It would of course be possible to record the detector signal during the excursion along line a as well, but this would require a more complicated processing program.

FIG. 4 shows a pulse and gradient sequence that has actually been used in NMR imaging. At the times P and Q, separated by 25 ms, a 90° pulse and a 180° pulse are applied; 25 ms after Q the centre of the echo appears; this time is defined as t=0. The signal is recorded from R to S, i.e. from t=−12.8 to +12.8 ms. The gradient $G_z$ selects the layer, the gradients $G_x$ and $G_y$ determine the path of the excursion in the $k_x,k_y$-plane.

During the 90° pulse only the spins in a thin layer perpendicular to z are excited, because of the gradient $G_z$ (layer selection). To keep this layer as thin as possible, a pulse is used that has an approximately Gaussian profile and an effective duration of about 3 ms; the bandwidth $\Delta f$ is thereby limited to 0.3 kHz. (In NMR spectroscopy the pulses are normally much shorter, e.g. 10 $\mu$s, with a bandwidth of the order of 100 kHz.) The relation between the bandwidth $\Delta f$ and the thickness $\Delta z$ of the layer of resonating spins is:

$$\Delta f = \Delta\omega/2\pi = \gamma\Delta B/2\pi = \gamma G_z \Delta z/2\pi.$$

For a gradient of $1.2\times 10^{-3}$ T/m the value of $\gamma G_z/2\pi$ is about 50 kHz/m; this is a gradient of about 0.3 percent over the region of homogeneity. Under these conditions, with $\Delta f=0.3$ kHz, the layer thickness is thus equal to (0.3/50)m=0.6 cm.

As a consequence of the z-gradient the spins in the different sublayers of $\Delta z$ have different frequencies, after the 90° pulse they therefore start to dephase. The 180° pulse, however, reverses the process (rephasing). When the detection starts at R, the dephasing has just been cancelled, because $G_z$ is switched in such a way that two integrals $$\int_P^Q$$

and $$\int_Q^R$$

are equal.

The excursion in the $k_x,k_y$-plane after the 90° pulse is determined by the x-gradients, the y-gradient and the 180° pulse. The 180° pulse is equivalent to a reflection of the transverse magnetizations of the subdomains in the x',y'-plane relative to the x'-axis. In complex notation this represents a reflection relative to the real axis (j→−j) and hence a jump from $k_x,k_y$ to $-k_x,-k_y$; (this applies only if f(x,y) is real, but this is always the case with our sequences). Along the detection path RS is a cross-section of F is determined. The procedure is carried out for 128 $G_y$ values. Between the determinations of two cross-sections it is necessary to allow a time of about one second to elapse, to give the spin system an opportunity to return more or less to thermal equilibrium. It thus takes about two minutes to measure one complete body slice.

For the digital processing the low-frequency signals $S_1$ and $S_2$ are sampled during detection at a typical rate of one sample per 0.2 ms. Each pair of samples yields a value for the complex function $F(k_x,k_y)$. After measurement of the complete body slice we thus have the values of $F(k_x,k_y)$ in a matrix of points in the $k_x,k_y$-plane. The computer then calculates f(x,y) from these values, and the result is displayed on the screen as a pattern of grey levels.

In a measurement program, let the main dimension of the object be 25 cm. The original r.f. signal then covers a frequency band of 20 kHz/m$\times$0.25 m=5 kHz, around the centre Larmor frequency of 6 MHz. Phase-sensitive detection shifts this to the band −2.5 to +2.5 kHz. The directly detected signals (S(t)) thus have frequencies from 0 to 2.5 kHz (negative frequencies are only of significance for the complex signal). To take these frequencies into account properly, it is necessary to sample the signals—in accordance with the "sampling theorem"—at a frequency of at least (2×2.5=) 5 kHz, i.e. once in each 0.2 ms. For the detection time $t_w$ this amounts to 128 samples, so that we obtain values for F at 128 points on the detection path. For the same data density in the $k_y$-direction the detection must be repeated for 128 $k_y$-values. The matrix of 128×128 F-values thus obtained is converted by the computer into 128×128 f-values, so that with an object of 250 mm×250 mm there is one value for each object element of 2 mm×2 mm. In reality, there are twice as many samples, F-values and f-values, because the signals and functions are complex.

Two corrections to this rather simplified account should be mentioned here. In the first place, the analog filter that reduces the bandwidth to 2.5 kHz would have to be an ideal filter to permit correct sampling at 5 kHz. Obviously any practical filter will not be ideal. We compensate for this by "digital filtering", which implies oversampling—we take one sample in each 0.1 ms. In the second place the matrix of 128×128 f-values is not converted directly into 128×128 grey values, but translated first—by means of a refined method of interpolation—into a matrix of 256×256 values, the image thus had "greyness elements" of dimensions 1 mm×1 mm. This is done to give the best visual display of the information available.

To summarize, in NMR imaging the accurate field-strength discrimination possible with nuclear magnetic resonance is converted by gradients in the magnetic field into spatial discrimination. An NMR tomograph consists of a large coil-magnet, gradient coils, r.f. equipment (for excitation and detection of the nuclear spin precession), program-control electronics and a computer for translating signals into images. Pulse NMR methods are used, generally with 90° and 180° pulses for excitation. The best-known versions of NMR imaging are 2D projection reconstruction and 2D Fourier zeugmatography. In the first of these a z-gradient is used to select a slice of thickness say 5 mm and parallel to the x-y-plane. Next a gradient is applied in a direction $\mu$ in the x,y-plane. The NMR spectrum is than a one-dimensional projection of the two-dimensional proton distribution f(x,y) in the slice. The 2D proton distribution f(x,y) is reconstructed from the projections for say 200 directions of $\mu$. The reconstruction takes place via the 2D Fourier transform $F(k_x,k_y)$ of f(x,y). Analysis shows that the NMR signal with a gradient in the direction $\mu$ is a faithful representation of a "cross-section" of F. It is thus possible to use the signals from different gradient directions to construct F and subsequently f. In the 2D projection reconstruction method the $k_x,k_y$-plane is in fact scanned via lines through the origin. In 2D Fourier zeugmatography this is done via parallel lines.

It is assumed, by way of example, that a two-dimensional data matrix is filled with sampling values from a spin echo measurement and that the one dimension of the data matrix in which half the data matrix is filled is the real time. In practice this means that spin echo resonance signals are sampled for only half the period during which they occur. For the description of a two-dimensional spin echo measurement reference is again made to the cited article by Locher. In the other dimension, being the pseduo time caused by the stepping of the preparation gradient, the data matrix is completely filled.

FIG. 1 shows a time axis with different instants which are important for the method as well as an image profile axis. The time axis, along which the time t is plotted, shows an interval from $t = -t_0$ to $t = t_0$; the one dimension of the data matrix is an image thereof. A spin echo resonance signal S(t) (not shown) will be at least substantially symmetrical with respect to the instant $t = 0$ during a spin echo measurement. During the partial measurement, the spin echo resonance signal S(t) will be sampled only from $t = -t_0$ to $t = t_1$ for given values of the preparation gradient (pseudo-time) in the case of the two-dimensional measurement. When the instant $t = t_1$ coincides with $t = 0$ a half-filled data matrix will be obtained. In the interval from $t = t_1$ to $t = t_0$ the data in the data matrix which is not known from sampling is estimated. $U_j(t)$ denotes a signal which corresponds, in the interval from $t = -t_0$ to $t = t_1$, to the (sampled) spin echo resonance signal S(t) and which is estimated in the interval from $t = t_1$ to $t = t_0$. FIG. 1 also shows an image profile axis along which an image parameter x is plotted a field of view being indicated from $x = -x_0$ to $x = x_0$. A body in which spin nuclei are excited by the spin echo resonance measurement should remain within this field of view in order to prevent aliasing problems during Fourier transformation. For an image profile f(x), for a given value of the preparation gradient, the image profile is the inverse Fourier transform of a data profile U(t) determined partly by sampling of the spin echo resonance signal and for the remainder by estimation, or of a column in the one dimension of the data matrix. In the method in accordance with the invention, the image profiles of all columns of the data matrix are determined in the one dimension in which half the data matrix is filled, after the Fourier transformation steps have first been performed in the other dimensions. Hereinafter, the steps of the method in accordance with the invention will be described for an image profile f(x). The phase of the image profile f(x) is estimated from data of the central part of the data matrix which is known as sampling values. The phase of an image profile arising after Fourier transformation is taken as an estimate $\Psi(x)$ for the phase. It is assumed that the estimated phase $\Psi(x)$ varies smoothly and slowly changes in the field of view. The image profile f(x) associated with the signal U(t) can be expressed in terms of the estimated phase $\Psi(x)$:

$$f(x) = r(x) \cdot e^{i\Psi(x)}, \qquad (1)$$

where r(x) is an unknown complex function of x, i is the square root of −1 and e is the exponential function. r(x) contains a real component (the desired image component) and an imaginary component (the undesirable image component).

r(x) should satisfy:

$$F\{r(x) \cdot e^{i\Psi(x)}\} = S(t) \text{ for } -t_0 < t < t_1, \qquad (2)$$

where F denotes the Fourier transform. Using the method in accordance with the invention, an estimate is iteratively made for the data which is not known from sampling. Each iteration step j produces an improved estimate, the inverse Fourier transform of the known and estimated data, to be referred to together as $U_j(t)$, producing an image profile $f_j(x)$ whose real image component increases and whose imaginary image component decreases after elimination of the phase $\Psi(x)$. The image profile $f_j(x)$ can be written as:

$$f_j(x) = \{r_j(x) + i \cdot q_j(x)\} \cdot e^{i\Psi(x)} \qquad (3)$$

where $r_j(x)$ and $q_j(x)$ are real functions, $r_j(x)$ being the desired image component and $i \cdot q_j(x)$ being the undesirable image component. Thus, $U_j(t)$ can be written as:

$$U_j(t) = R_j(t) + Q_j(t) \qquad (4)$$

where $R_j(t)$ generates the desired image component $r_j(x)e^{i\Psi(x)}$ and $Q_j(t)$ generates the undesired image component $i q_j(x)e^{i\Psi(x)}$ by means of a Fourier transformation. In accordance with the invention, $Q_j(t)$ which generates the undesired image component $i \cdot q_j(t)$ is modified in each iteration step in the interval from $t = t_1$ to $t = t_0$, during which interval the estimation of data is free. In the interval from $t = -t_0$ to $t = t_1$, no free choice exists as regards $Q_j(t)$, because therein the data of $Q_j(t)$, obtained by sampling of the signal $S(t)$, should remain unmodified. When $Q_j(t)$ is suitably chosen in each iteration step, the undesired image component $i \cdot q_j(x)$ will decrease. In an iteration step $j+1$, a data profile $U_{j+1}(t)$ is determined from the preceding iteration step $j$ as follows:

$$U_{j+1}(t) = R_j(t) + V(t) \cdot Q_j(t), \qquad (5)$$

where $Q_j(t)$ is modified by multiplication by a function $V(t)$. Considering the foregoing, it will be evident that $V(t)$ must be 1 for $t < t_1$ and can be chosen at random for $t > t_1$. The image profile $f_{j+1}(x)$ is the inverse Fourier transformation of $U_{j+1}(t)$. It is generally known that a product in the t-domain can be written as a convolution in the x-domain. In that case the undesired image component is transformed into the following:

$$i \cdot q_j(x) \cdot e^{i\Psi(x)} * v(x), \qquad (6)$$

where $*$ is the convolution operation and $v(x)$ is the Fourier transform of $V(t) \cdot R_j(t)$ which generates the desired image component does not change. When the function $V(t)$ is suitably chosen, the convolution in each iteration step will increase the desired image component and decrease the undesired image component. A suitable choice for $V(t)$ is, for example $V(t) = 1$ for $t < = t_1$ and $V(t) = 0$ for $t > t_1$. A transformation of the estimated data will occur and the undesired image component will converge towards zero. When $t_1 = 0$ is chosen, it is attractive to take $V(t) = -\text{sign}(t)$ whose Fourier transform is $v(x) = i/(\pi \cdot x)$, a strongly peaked function around $x = 0$. Moreover, the phase $\Psi(x)$ varies very smoothly. As a result, in each iteration step the convolution will contribute substantially more to the desired image component that to the undesired image component; this will become evident when the convolution is written in full. When $V(t) = -\text{sign}(t)$ is chosen, it can simply be demonstrated that $$U_{j+1}(t) = R_j(t) \cdot Q_j(t)$$

can be written as:

$$U_{j+1}(t) = F\{\text{conj}[f_j(x)] \cdot e^{2i\Psi(x)}\} \text{ for } t > t_1, \qquad (7)$$

where conj is the conjugated complex, so that a method is obtained which can be simply implemented. The functions $r_j(t)$, $q_j(t)$, $R_j(t)$ and $Q_j(t)$ no longer explicitly occur therein. When $t_1 > 0$, the transformation of the estimated data cannot be fully executed, but must be restricted to the data in the data matrix for $t > t_1$. This means that the method is effective only for the high-frequency components of the image. In the method in accordance with the invention, the low-frequency components already have the desired phase $\Psi(x)$ because they have been generated from sampling values of the spin echo resonance signal, or $Q_j(t)$ will already be approximately zero around $t = 0$, so that the result of the method will not be affected by this restriction. When $V(t) = -\text{sign}(t)$ is chosen it will often be sufficient to perform from 1 to 3 iterations per image profile. The undesired image component then quickly converges to zero.

FIG. 2 shows a flowchart of a preferred version of a method for an image profile. The method for the image profile commences in block 1. Initialization takes place in block 2. Therein j is the iteration step and n is the number of iteration steps. j is initialized at zero and n is initialized at $n_0$. For $t < = t_1$ the data profile $U_j(t)$ assumes the sampling values of the spin echo resonance signal $S(t)$ and for $t < t_1$, $U_j(t)$ is initialized at zero. In block 3 an image profile $f_j(x)$ is determined by inverse Fourier transformation of the data profile $U_j(t)$. In block 4 the next data profile $U_{j+1}(t)$ is estimated. For $t < = t_1$, $U_{j+1}(t)$ assumes the sampling values of the spin echo resonance signal $S(t)$ and for $t > t_1$, $U_{j+1}(t)$ equals the expression given in (7). In block 5 it is tested whether all iterations have been completed. If this is not the case, the iteration step is incremented in block 6 and the procedure returns to block 3 for the next iteration step. When all iteration steps have been completed, however, in block 7 the image profile $f_{j+1}(x)$ is determined from the data profile $U_{j+1}(t)$, determined during the last iteration step, by inverse Fourier transformation. The method for the image profile is completed in block 8 so that a next image profile can be treated.

Hereinafter two implementations in accordance with the invention will be described for different choices of $V(t)$ in which the desired image component $r_j(x)$ and the undesired image component $i \cdot q_j(x)$ occur explicitly. In an iteration step $j+1$, the choice $v(t) = -\text{sign}(t)$ results in a data profile $U_{j+1}(t)$ determined by:

$$U_{j+1}(t) = S(t), \ t < = t_1$$

$$U_{j+1}(t) = R_j(t) - Q_j(t), \ t > t_1.$$

When the transform $R_j(t)$ associated with the desired image component $r_j(x)$ is substracted from $U_{j+1}(t)$ for $t < = t_1$ as well as for $t > t_1$, an implementation will be obtained which is equivalent to the version shown:

$$U_{j+1}(t) = S(t) - R_j, \ t < = t_1$$

$$U_{j+1}(t) = -Q_j(t), \ t > t_1$$

As can be simply demonstrated, an image profile $f_{j+1}(x)$ is then determined from an image profile $f_j(x)$ in the iteration step $j+1$:

$$f_{j+1}(x) = f_j(x) + r_{j+1}(x) \cdot e^{i\cdot\Psi(x)}, \qquad (8)$$

where in the iteration step $j$ $r_j(x)$, $q_j(x)$, $R_j(t)$ and $Q_j(t)$ are determined by:

$$IF\{U_j(t)\} = \{r_j(x) + i \cdot q_j(x)\} \cdot e^{i\cdot\phi(x)},$$

$$R_j(t) = F\{r_j(x) \cdot e^{i\cdot\phi(x)}\}, \text{ and}$$

$$Q_j(t) = F\{i \cdot q_j(x) \cdot e^{i\cdot\phi(x)}\},$$

respectively, The choice $V(t)=1$ for $t<t_1$ and $V(t)=0$ for $t>t_1$ offers:

$$U_{j+1}(t)=S(t), t<=t_1$$

$$U_{j+1}(t)=R_j(t), t>t_1$$

after which the iteration formulas $$U_{j+1}(t)=S(t)-R_j(t), t<=t_1$$

$$U_{j+1}(t)=0, t>t_1$$

are obtained after subtraction of $R_j(t)$, an image profile then being determined in the iteration step $j+1$ in accordance with formula 8.

The method is not restricted to the described examples; many alternatives are feasible for those skilled in the art. For example, the method is not restricted to the described spin echo resonance measurement where half the data matrix is filled in the real-time dimension of the data matrix; half the data matrix can also be filled in a pseudo-time dimension. Also, in the real-time dimension, an interval $[-t_1,t_o]$ might be sampled instead of $[-t_o, t_1]$ which is particularly useful in practice to obtain short echo times and low signal bandwidths. The interruption of the iterations can also be determined by an error criterion as an alternative for the choice of a fixed number of steps.

What is claimed is:

1. A method of reconstructing an image of a nuclear magnetization distribution in a body by a complex Fourier transformation of a multi-dimensional data matrix which contains data profiles comprising sampling values of resonance signals obtained from a magnetic resonance measurement performed on the body, the data matrix in one dimension being at least half-filled with sampling values, the data profiles being converted after the complex Fourier transformation to image profiles having a real and an imaginary image component associated with phase information, the reconstruction utilizing phase information which is estimated from known sampling value data of a central part of the data matrix, wherein the complex Fourier transformation is performed first on the sampling values in the dimensions other than the one dimension and, thereafter, a Fourier transformation step is performed on each data profile which is partly filled with sampling values in a number of steps after an estimation is made of the data not known from sampling, the estimation of the data not known from sampling being added to the partly filled data profile and then being iteratively changed in each subsequent step in order to obtain, after reconstruction, an image wherein phase information at least approximates the phase estimation from the central part of the data matrix.

2. A method as claimed in claim 1, involving an initial estimation for the data not known from sampling, characterized in that in a step after the Fourier transformation step of the data profile a next estimation is obtained for the data not known from sampling from an image profile thus obtained in the one dimension, said next estimation, after Fourier transformation thereof followed by elimination of the phase, increasing the real image component in the image profile and decreasing the imaginary image component in the image profile, after which in subsequent steps ever smaller imaginary image components and an ever better approximation of the phase of the image profile are obtained.

3. A method as claimed in claim 2, characterized in that the next estimation for the data not known from sampling values is realized by performing a Fourier transformation on the conjugated complex image profile of the preceding estimation with double the phase.

4. A method as claimed in any one of the preceding claims, characterized in that each estimation is performed in a fixed number of steps.

* * * * *